United States Patent

Morris et al.

(10) Patent No.: US 7,961,045 B2
(45) Date of Patent: Jun. 14, 2011

(54) AMPLIFIER PRE-DISTORTION SYSTEMS AND METHODS

(75) Inventors: Bradley John Morris, Ottawa (CA); Arthur Thomas Gerald Fuller, Carp (CA)

(73) Assignee: Nortel Networks Limited, Mississauga, Ontario (CA)

( * ) Notice: Subject to any disclaimer, the term of this patent is extended or adjusted under 35 U.S.C. 154(b) by 74 days.

(21) Appl. No.: 12/058,027

(22) Filed: Mar. 28, 2008

(65) Prior Publication Data

US 2008/0238544 A1    Oct. 2, 2008

Related U.S. Application Data

(60) Provisional application No. 60/909,168, filed on Mar. 30, 2007.

(51) Int. Cl.
*H03F 1/26* (2006.01)
(52) U.S. Cl. ............... 330/149; 330/124 R; 330/295
(58) Field of Classification Search .......... 330/149, 330/124 R, 295
See application file for complete search history.

(56) References Cited

U.S. PATENT DOCUMENTS

| | | | |
|---|---|---|---|
| 5,886,573 A * | 3/1999 | Kolanek | 330/10 |
| 6,472,934 B1 * | 10/2002 | Pehlke | 330/10 |
| 7,116,167 B2 * | 10/2006 | Ahn | 330/151 |
| 7,170,342 B2 * | 1/2007 | Suzuki et al. | 330/149 |
| 7,230,996 B2 * | 6/2007 | Matsuura et al. | 375/296 |
| 7,471,739 B1 * | 12/2008 | Wright | 375/297 |
| 7,555,057 B2 * | 6/2009 | Staszewski et al. | 375/296 |
| 2004/0263246 A1 | 12/2004 | Robinson et al. | |
| 2006/0181345 A1 | 8/2006 | Saed | |
| 2007/0164818 A1 | 7/2007 | Horiguchi et al. | |
| 2008/0111622 A1 | 5/2008 | Sperlich et al. | |

FOREIGN PATENT DOCUMENTS

WO    2006019017 A1    2/2006

* cited by examiner

*Primary Examiner* — Patricia Nguyen

(57) ABSTRACT

A method of optimizing performance of a multiple path amplifier includes: splitting an input signal to derive a respective sub-signal for each branch of the multiple path amplifier; independently pre-distorting each sub-signal using a known performance characteristic of its associated branch of the multiple path amplifier; and supplying each pre-distorted sub-signal to its associated branch of the multiple amplifier.

16 Claims, 9 Drawing Sheets

AMPLIFIER PRE-DISTORTION SYSTEMS AND METHODS

CROSS-REFERENCE TO RELATED APPLICATIONS

This application is based on, and benefit of, U.S. Provisional Patent Application No. 60/909,168 filed Mar. 30, 2007, the entire contents of which is hereby incorporated herein by reference.

TECHNICAL FIELD

The present invention relates to pre-distorting amplifiers, more specifically to pre-distorting multiple path power amplifier arrangements.

BACKGROUND OF THE INVENTION

The voltage output of an amplifier as a function of its input voltage is typically not linear over certain ranges of input voltages, particularly larger input voltages. Pre-distortion is a technique by which an input signal is pre-distorted in order to compensate for these non-linear ranges of an amplifier.

One of the goals of power amplifier design for wireless base-stations is increased efficiency. Improvements in efficiency can lead to a reduced amplifier cost (e.g. by allowing for the use of cheaper transistors with reduced power handling capability) and reduced operating expense (e.g. reduced size, reduced cooling requirements, reduced power requirements, etc.). In a conventional power amplifier, various techniques are often applied to class AB output stage configurations to achieve a desired level of performance, but the benefit of these techniques are limited in efficiency by the class AB output stage.

A multiple-path output stage, such as, for example, a so-called Doherty Amplifier, offers the potential of increased efficiency, but it is difficult to pre-distort the input so as to meet demanding wireless specifications of such an amplifier arrangement. Further efficiency enhancement can be achieved with an asymmetric Doherty amplifier (e.g. a Doherty amplifier arrangement where different technologies are used for the main and peaking amplifiers) but such an arrangement further increases the pre-distortion challenge.

Techniques of optimizing performance of a multiple path amplifier that overcome at least some of the above-noted deficiencies are highly desirable.

SUMMARY OF THE INVENTION

The present invention addresses the above-noted problems by providing techniques for optimizing performance of a multiple path amplifier.

Thus, an aspect of the present invention provides a method of optimizing performance of a Doherty amplifier, the method comprises: splitting an input signal to derive a respective sub-signal for each branch of the Doherty amplifier; independently pre-distorting each sub-signal using a known performance characteristic of its associated branch of the Doherty amplifier; and supplying each pre-distorted sub-signal to its associated branch of the Doherty amplifier.

Embodiments of the present invention employ a pre-distortion mechanism that may use knowledge of the input signal (e.g. such as envelope, amplitude, or phase, or some combination of parameters) as well as other available system waveforms and characteristics (e.g. TDD state). Embodiments of the invention may provide any one or more of the following: (a) a multi-input pre-distortion mechanism capable of producing pre-distortion characteristics, (b) the ability to create multiple distinct pre-distorted outputs in order to support multi-input amplifier arrangements, (c) a dynamically reconfigurable pre-distortion architecture that can support multiple amplifier architectures or multiple characteristics for a single amplifier (e.g. under different operating conditions) (d) hardware efficient training algorithms and mechanisms that determine the optimum pre-distortion coefficients, and (e) the use of the input envelope and input signals to divide the pre-distortion into distinct regions. These regions may or may not overlap. In this way, one may obtain improved pre-distortion performance for multiple path power amplifier arrangements.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENT

The present invention provides pre-distortion techniques for various configurations of multiple path power amplifiers. Embodiments of the present invention are described below, by way of example only, with reference to FIGS. 1-7.

One conventional technique applied to pre-distort a power amplifier (PA) is to treat the PA as a single input-single output block, and pre-distort the input signal Si based on a comparison of the original signal and the signal So at the output of the PA. Although this may be effective where there is only 'one path' in the PA, it does not provide any independent correction to the multiple paths in a multiple path power amplifier.

Figure 1:
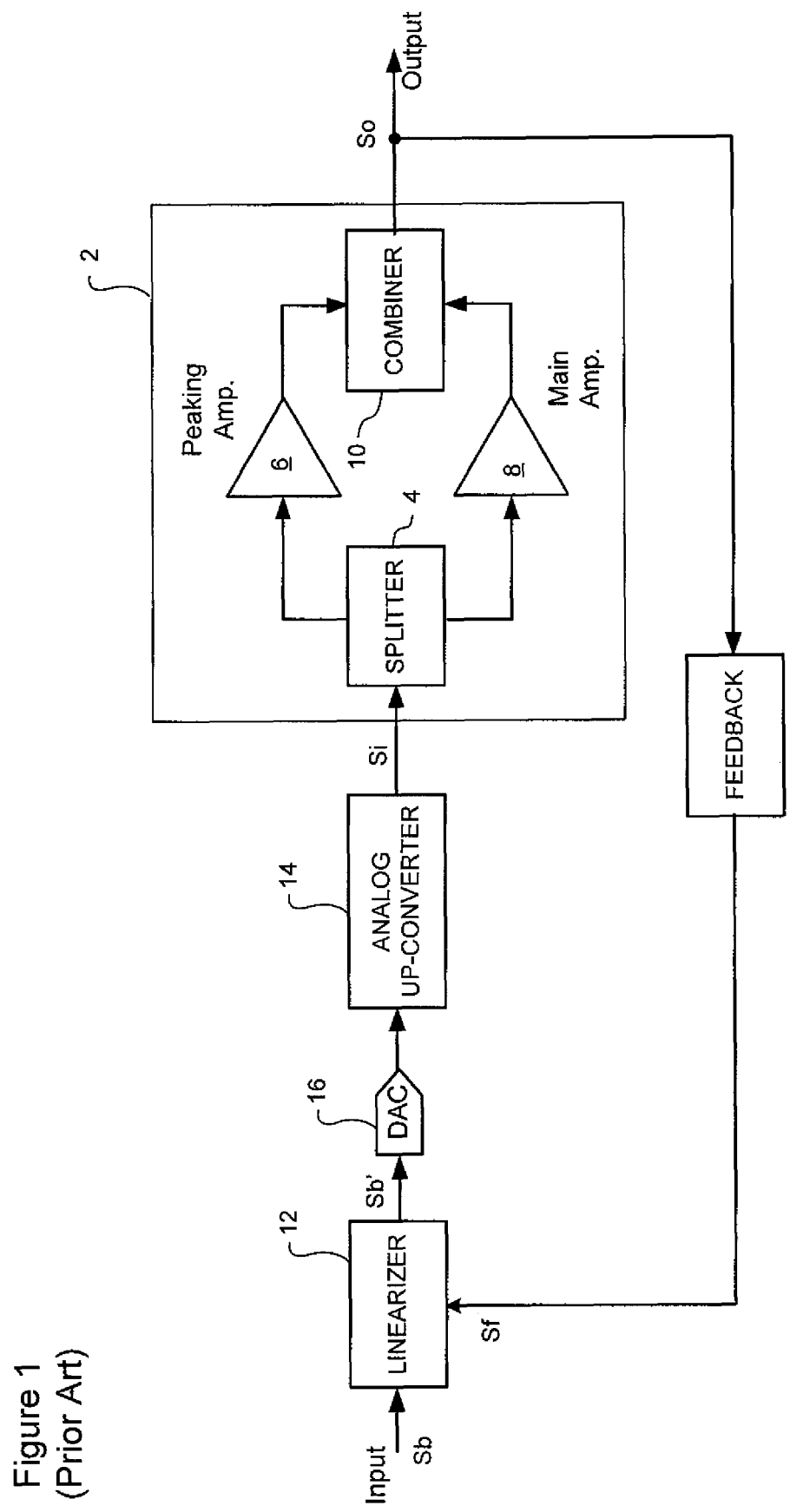
FIG. 1 is a block diagram schematically illustrating a typical Doherty amplifier system known in the Prior Art.

Referring to FIG. 1, a classical Doherty amplifier 2 includes a signal splitter 4; a peaking amplifier 6, a main amplifier 8, and a combiner network 10. In operation a Radio Frequency (RF) input signal Si is split by the analog power splitter 4 and fed to the two amplifiers 6 and 8. The respective amplified signals are then recombined by the combiner network 10 to produce an output signal So. Typically, the amplifier input signal Si is generated by a linearizer 12, which is normally cascaded with an analog up-conversion block 14. As is known in the art, the linearizer 12 pre-distorts a baseband input signal Sb in order to compensate non-linearity of the up-converter 14 and amplifier 2. The up-conversion block 14 operates to up-convert the pre-distorted baseband signal to radio frequency (RF).

In some cases analog linearization may be implemented, using well known circuit techniques. However, a more versatile arrangement implements a digital function in the linearizer 12, using coefficients that are calculated based on a feedback signal Sf derived from the amplifier output signal So. The pre-distorted signal Sb' output by the linearizer 12 is then converted into an analog baseband signal by a digital to analog converter (DAC) 16. Digital pre-distortion has the advantage that the coefficients can be adaptively computed, using known techniques, to optimize the output signal So to a far greater degree of precision than is possible using analog linearization techniques. This training operation may either be performed once (e.g. during system layout and test) or periodically during run-time, as desired. As is known in the art, digital signal pre-distortion can compensate for memory effects, and thus appropriately adjust the amplitude and phase nonlinearity of the signal applied to the amplifier 2.

As is known in the art, the feedback signal Sf can combined with Sb (or Si) to compute any of a variety of known error or cost functions. The linearizer can then operate to compute the coefficients so as to optimize the value of the output signal So. In some cases, this means driving the difference between the input signal Sb and a scaled version of the feedback signal Sf to a local minima, while in other cases the difference is driven to zero (or some other predetermined value). In either case, the feedback loop may be implemented in the digital domain by either down converting the RF output signal So to baseband and then sampling the baseband signal, or by sampling the RF output signal So. The former technique allows potentially higher precision but at the cost of a more complex receiver whereas the later achieves a lower cost receiver at the expense of precision.

As described above, in the classical Doherty amplifier 2 the input signal Si is split within the amplifier 2, downstream of the Linearizer 12. In view of this arrangement, the Doherty amplifier 2 is typically viewed as a single input/single output block, and the linearizer must be designed to optimize system performance, treating both the peaking amplifier 6 and the main amplifier 8 as a single amplifier block. This approach to pre-distortion means that compensation of non-linearities is dependent on a close match between the peaking and main amplifiers 6 and 8. For various reasons, such as manufacturing variations, perfect symmetry between the peaking and main amplifiers 6 and 8 is very difficult to achieve, so the degree of signal correction that can be obtain is limited. Additionally, this also limits the ability to use different (not matched) amplifiers (transistors).

The present invention overcomes these issues by providing systems in which each path of a multiple path amplifier are independently pre-distorted. Representative embodiments of the invention are described below.

Figure 2:
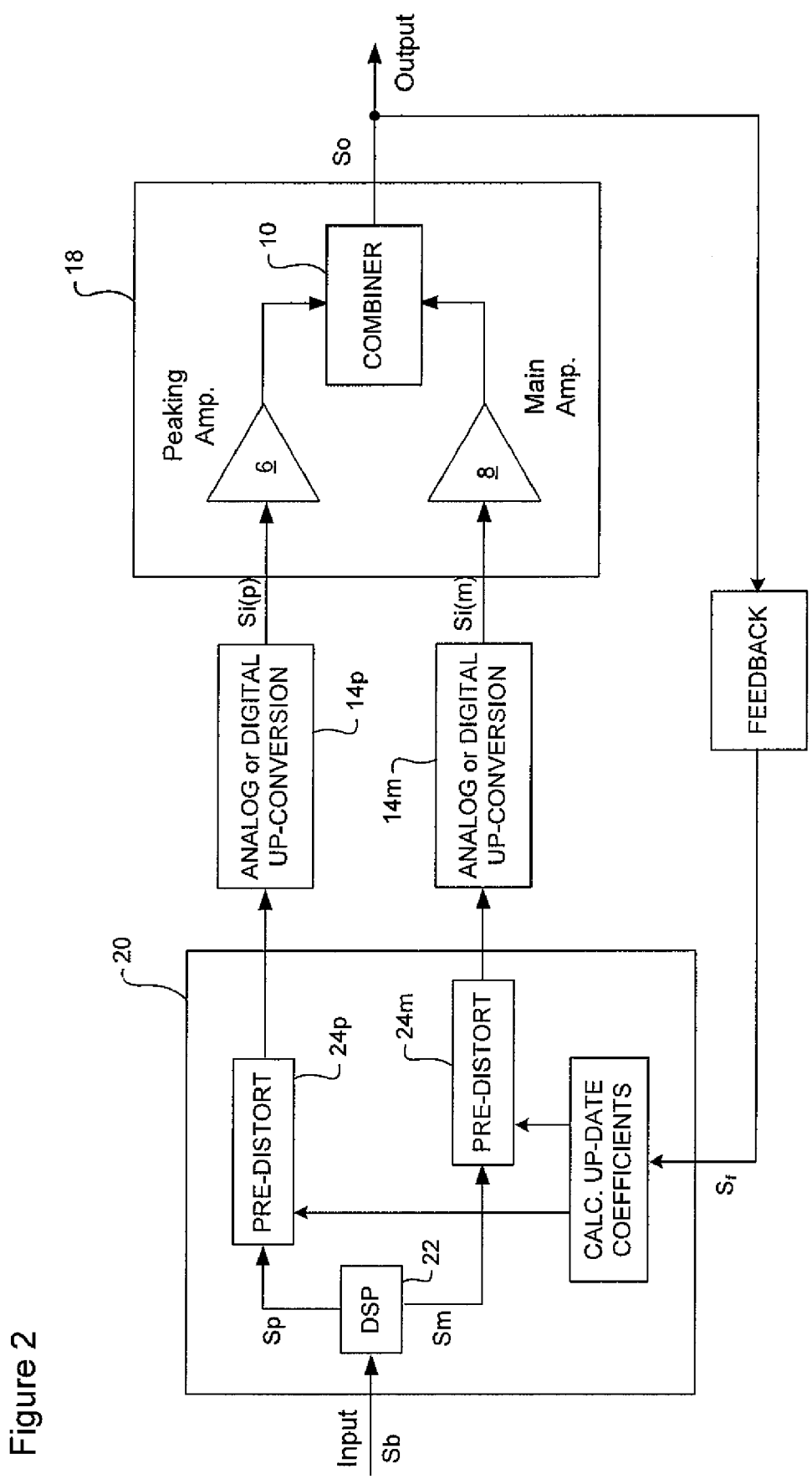
FIG. 2 is a block diagram schematically illustrating a multiple-path amplifier system in accordance with a first representative embodiment of the present invention.

FIG. 2 shows a first representative embodiment of a system in accordance with the present invention. As may be seen in FIG. 2, a modified Doherty amplifier 18 is similar to the classical Doherty Amplifier 2 of FIG. 1, except that the analog splitter 4 has been removed. This means that the modified Doherty amplifier 18 is a two-input/single output device, in which both branches 6,8 are available for independent pre-distortion. A corresponding digital linearizer 20 is provided, which includes a digital signal processing function (DSP) 22 for processing a baseband input signal Sb to derive the respective branch sub-signals Sp and Sm, each of which is then processed by a respective pre-distortion block 24. Each pre-distortion block 24 implements a digital linearization function based on respective coefficients calculated using a feedback signal Sf, in a manner similar to that described above. In this case, however, the coefficients supplied to each pre-distortion block 24 can be computed to optimize each of the peaking and main amplifier paths independently of one another. A respective DAC 18 (not shown in FIG. 2) and analog up-converter 14 can be provided for up-converting each pre-distorted branch sub-signal to RF upstream of the modified Doherty amplifier 18.

The digital signal processing function 22 may implement any of a variety of techniques for deriving the branch sub-signals Sp and Sm from the baseband input signal Sb. For example, the DSP 22 may implement an amplitude splitting scheme using a predetermined threshold, as will be described below in greater detail. Alternatively, a power splitting scheme may be implemented, such that the power levels of the two branch sub-signals are equal (or follow some other desired relationship). Other mathematical functions could also be used to generate the branch sub-signals, without departing from the present invention.

As may be appreciated, by moving the signal splitting function into the digital domain at the linearizer 20, a much more complex and controllable split can be achieved, as compared to an analog power splitter. One benefit is that the respective sub-signals Si(p) and Si(m) supplied to the peaking and main amplifiers 6 and 8 can be pre-distorted with different sets of linearizer coefficients, to allow much better linearization to be achieved. This allows flexibility in the design and selection of the main and peaking amplifiers 6 and 8, so that, for example, symmetry between the two amplifiers is no longer required.

In the embodiment of FIG. 2, the feedback signal Sf is derived from the output signal So, in a manner directly analogous to that of FIG. 1. In the embodiment of FIG. 2, however, the feedback signal Sf is used to calculate respective different pre-distortion coefficients for each branch sub-signal Sp and Sm. If desired, the feedback signal Sf may alternatively be derived from the output of each of the peaking and main amplifiers (i.e. by tapping the output of each amplifier upstream of the combiner 10), either alone or in combination with the output signal So. As a still further alternative, other amplifier parameters (e.g. amplifier voltage, current, gate bias etc.) may be used alone or in combination with any other parameters for this purpose.

Figure 3:
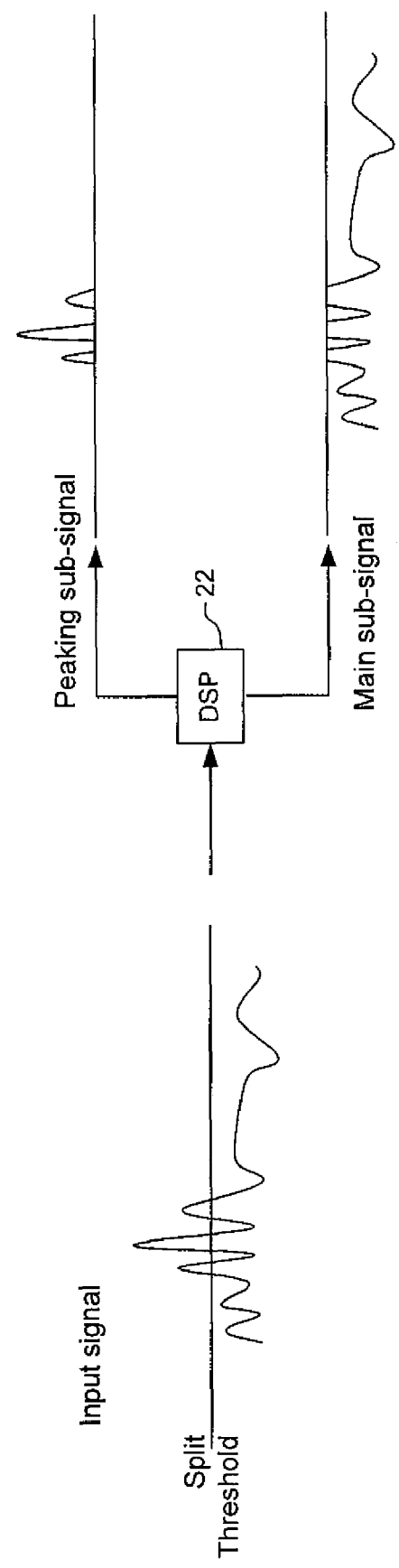
FIG. 3 schematically illustrates operation of a splitter usable in the multiple-path amplifier of FIG. 2.

By way of example only, FIG. 3 schematically illustrates an amplitude splitting scheme, in which the baseband input signal Sb (shown as an analog signal for convenience of illustration only) is divided into a peaking signal Sp and a main signal Sm using a predetermined slicing threshold. This splitting method follows the classical Doherty design, in which the main amplifier 8 amplifies most of the of the signal, whereas the peaking amplifier 6 amplifies only signal peaks above a predetermined threshold (which classically corresponds with saturation of the main amplifier 8). With the arrangement of FIG. 2, respective different pre-distortion coefficients can be calculated for each branch, so as to optimize the performance of each branch independently of the other. This approach reduces the matching requirements for the main and peaking amplifier designs while improving performance. In addition, the use of a DSP 22 means that the slicing threshold can be adaptively adjusted, as desired, to aid in optimization of the overall system performance.

As may be seen in FIG. 3, each of the branch sub-signals exhibit sharp transitions (discontinuities) at the slicing threshold point. In some embodiments, the pre-distortion (or linearization) function implemented by the pre-distorters 24 may modify these transitions to minimize spurious emissions (noise) created by the abrupt transitions, while ensuring that the final combined output signal faithfully represents the input signal scaled by the overall amplifier gain.

Figure 4:
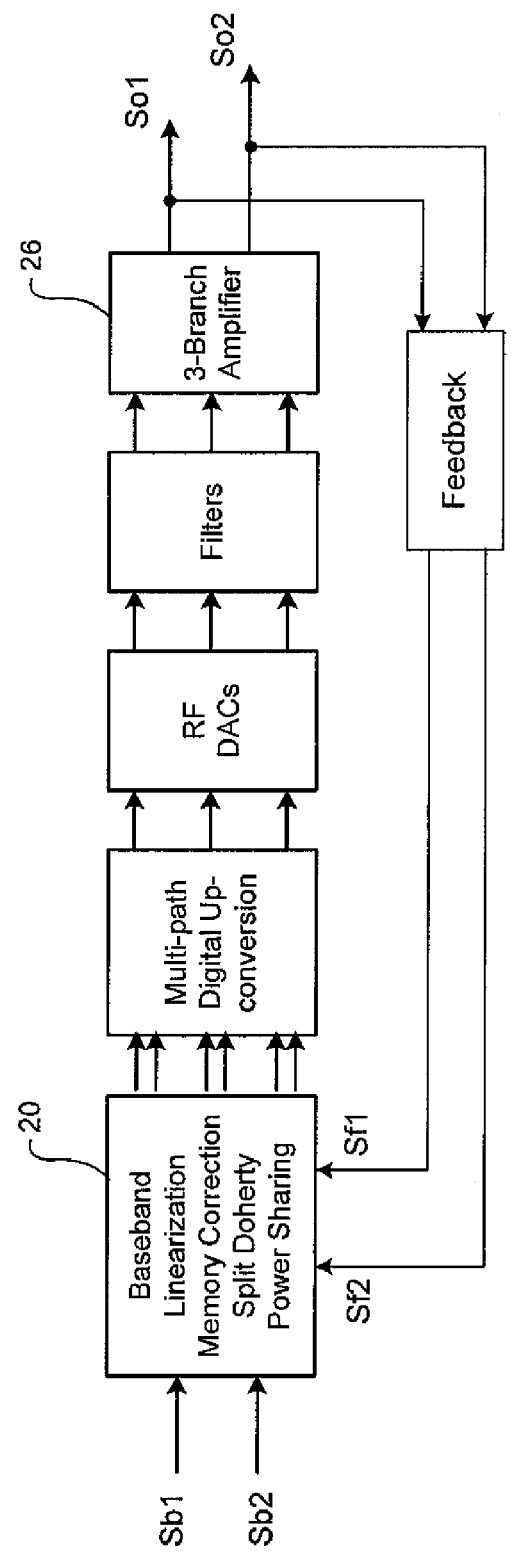
FIG. 4 is a block diagram schematically illustrating a multiple path amplifier system in accordance with a second representative embodiment of the present invention.
Figure 5:
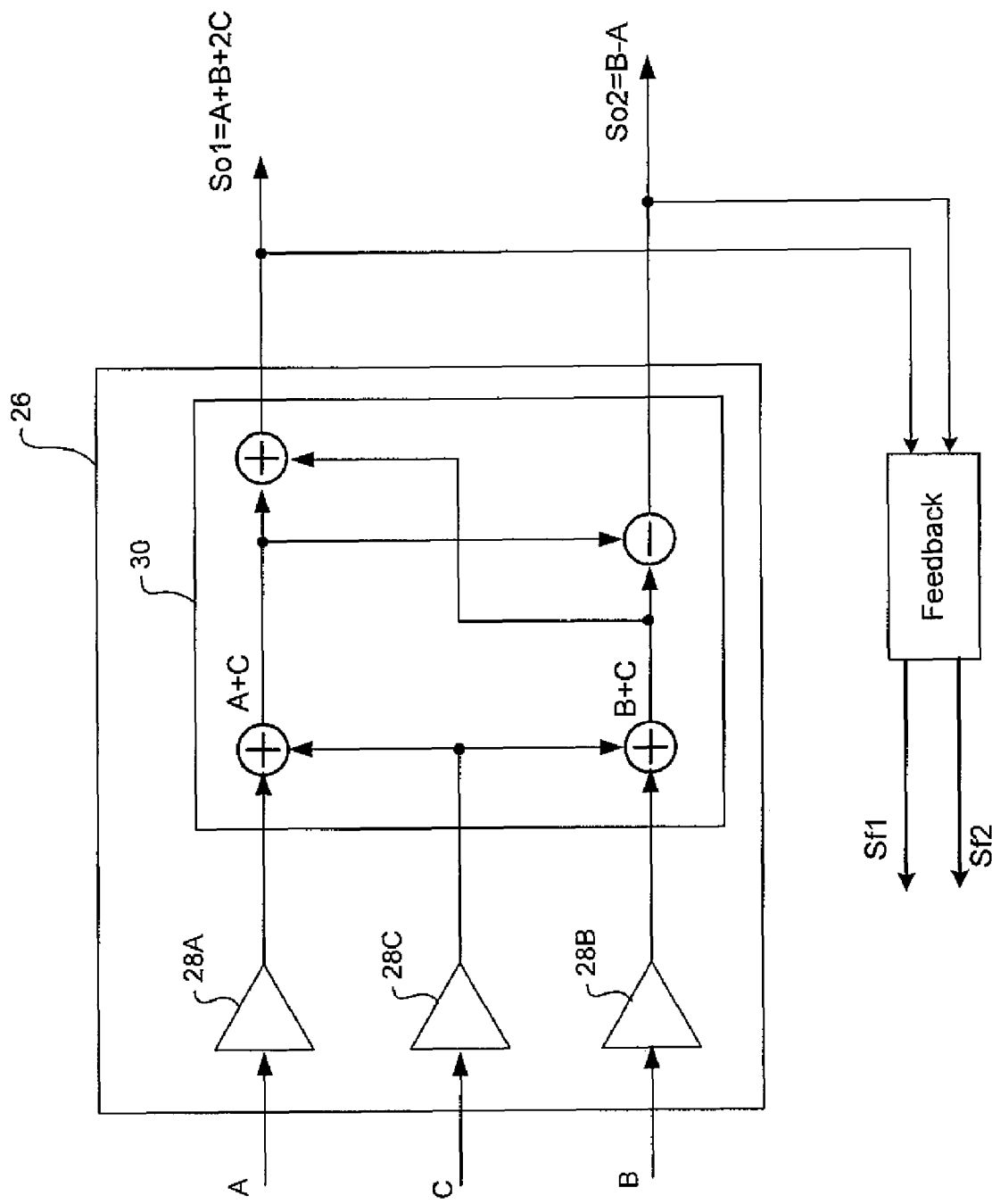
FIG. 5 is a block diagram schematically illustrating a Three-Branch power amplifier usable in the system of FIG. 4.

FIGS. 4 and 5 show a representative transmitter system utilizing a three-branch amplifier 26, in which three amplified sub-signals are combined to generate two output signals. In this case, the DSP 22 of the linearizer 20 is designed to process two input signals (Sb1 and Sb2) to derive three branch sub-signals, which are then pre-distorted as described above before being amplified and combined into two corresponding output signals (So1 and So2). In a WiMAX system, for example, the input signals Sb1 and Sb2 may respectively represent main and diversity signals. As will be appreciated, in this case, the use of DSP 22 in the linearizer 20 facilitates implementation of a complex mathematical relationship between the two input signals Sb1 and Sb2 and the branch sub-signals. For example, the DSP 22 may operate to process the two input signals Sb1 and Sb2 to generate respective main signals A and B, and a common peaking signal C.

Also shown in FIG. 4 is multi-path Digital Up-conversion, RF DACs and Filters (e.g. Surface Acoustic Wave (SAW) filters), all of which operate in a conventional manner, and do not require detailed description herein.

As may be seen in FIG. 5, the three-branch amplifier 26 receives the three analog signals (A, B and C) from the linearizer 20; amplifies them using respective amplifiers 28, and then combines the amplified signals using a combiner network 30, to generate the desired output signals So1 and So2. As will be appreciated, the design of the combiner network will be designed jointly with the signal processing function implemented by the DSP 22 to derive the three branch signals A B and C.

Finally, each of the output signals So1 and So2 can be used to derive respective feedback signals Sf1 and Sf2 for each pre-distorter 24 of the linearizer 20, as shown in FIG. 5. If desired, feedback for the pre-distorters 24 may be based on the output signals So1 and So2, either alone or in combination with internal signals such as, for example, the amplified branch sub-signals (at the output of each amplifier 28), or other internal amplifier measurements, as described above.

Figure 6:
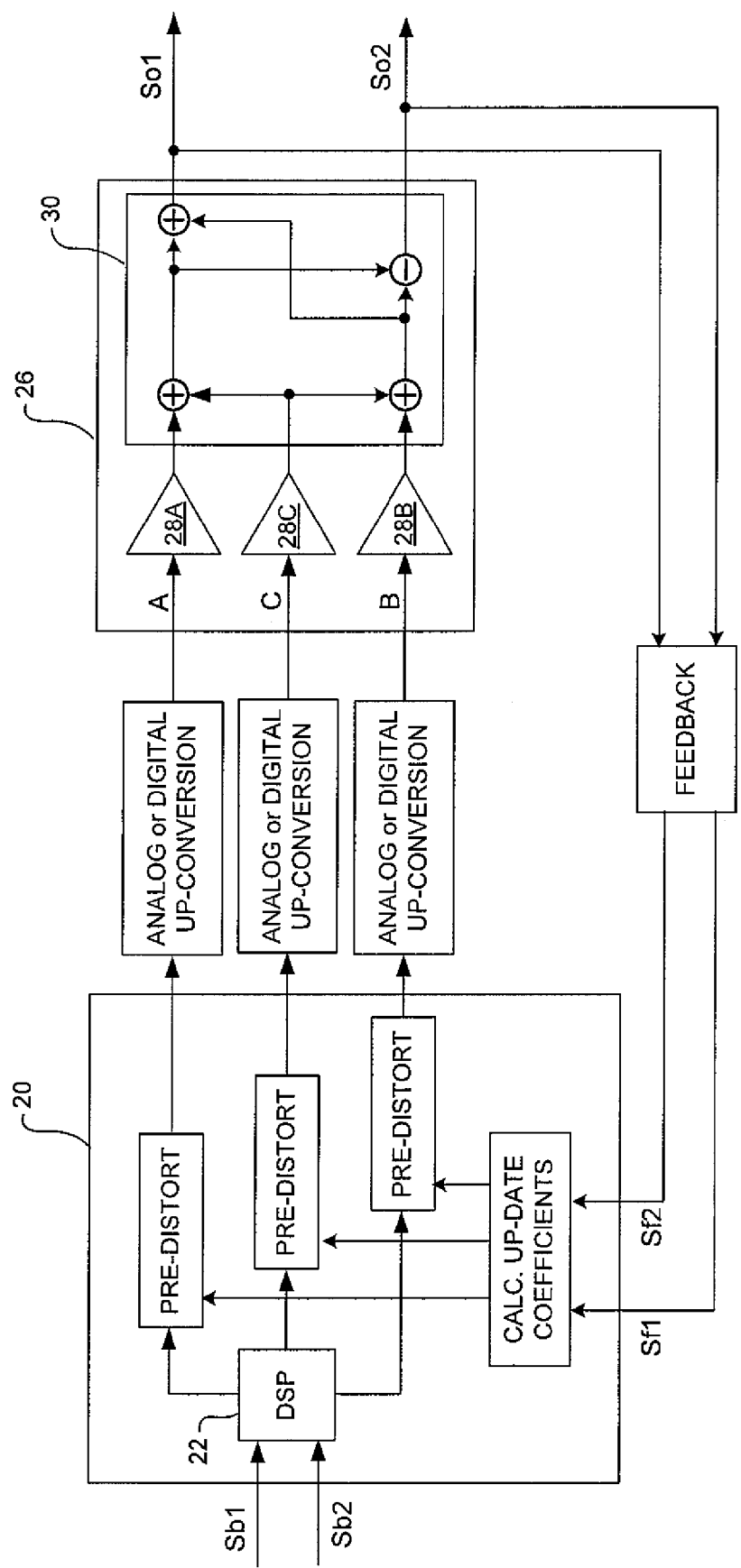
FIG. 6 is a block diagram schematically illustrating an alternative Three-Branch power amplifier usable in the system of FIG. 4.

FIG. 6 shows another transmitter system in accordance with the present invention, which utilizes a three branch amplifier 26. In the embodiment of FIG. 6, a 2 input/2 output configuration is illustrated similar to that of FIGS. 4 and 5. However, the utilization of the splitting scheme implemented by the DSP 22 is flexible and can be chosen to reflect the desired amplifier arrangement. For example, one peaking amplifier plus 2 main amplifiers (as described above with reference to FIGS. 4 and 5), and two peaking amplifiers plus one main amplifier, or three similar amplifiers where the linearization algorithm minimizes the usage of each in some beneficial way are all possible arrangements. Thus, the branch sub-signals A, B, and C can be defined as respective functions of the two inputs: e.g. $A=f_1(Sb_1, Sb_2)$, $B=f_2(Sb_1, Sb_2)$, and $C=f_3(Sb_1, Sb_2)$. During run-time, the DSP 22 operates to process the two baseband input signals (Sb1, Sb2) in accordance with the defined functions f1, f2, f3 to generate the three branch sub-signals (A, B, C) Similarly, the output signals $So_1=G*Sb_1$ and $So_2=G*Sb_2$ can be defined as functions of the amplified branch sub-signals $g_1*A$, $g_2*B$ and $g_3*C$ (for example, $So_1=fm(g_1*A, g_2*B, g_3*C)$ and $So_2=fd(g_1*A, g_2*B, g_3*C)$), which are implemented by the combining network 30 of the multiple path amplifier 26.

As may be appreciated, by splitting/combining signals in this manner, a transmitter can be realized with fewer parallel branches than would be required if the classical signal splitting arrangement (i.e. respective main and peaking paths for each input signal) of FIGS. 1-3 was used.

Figure 7:
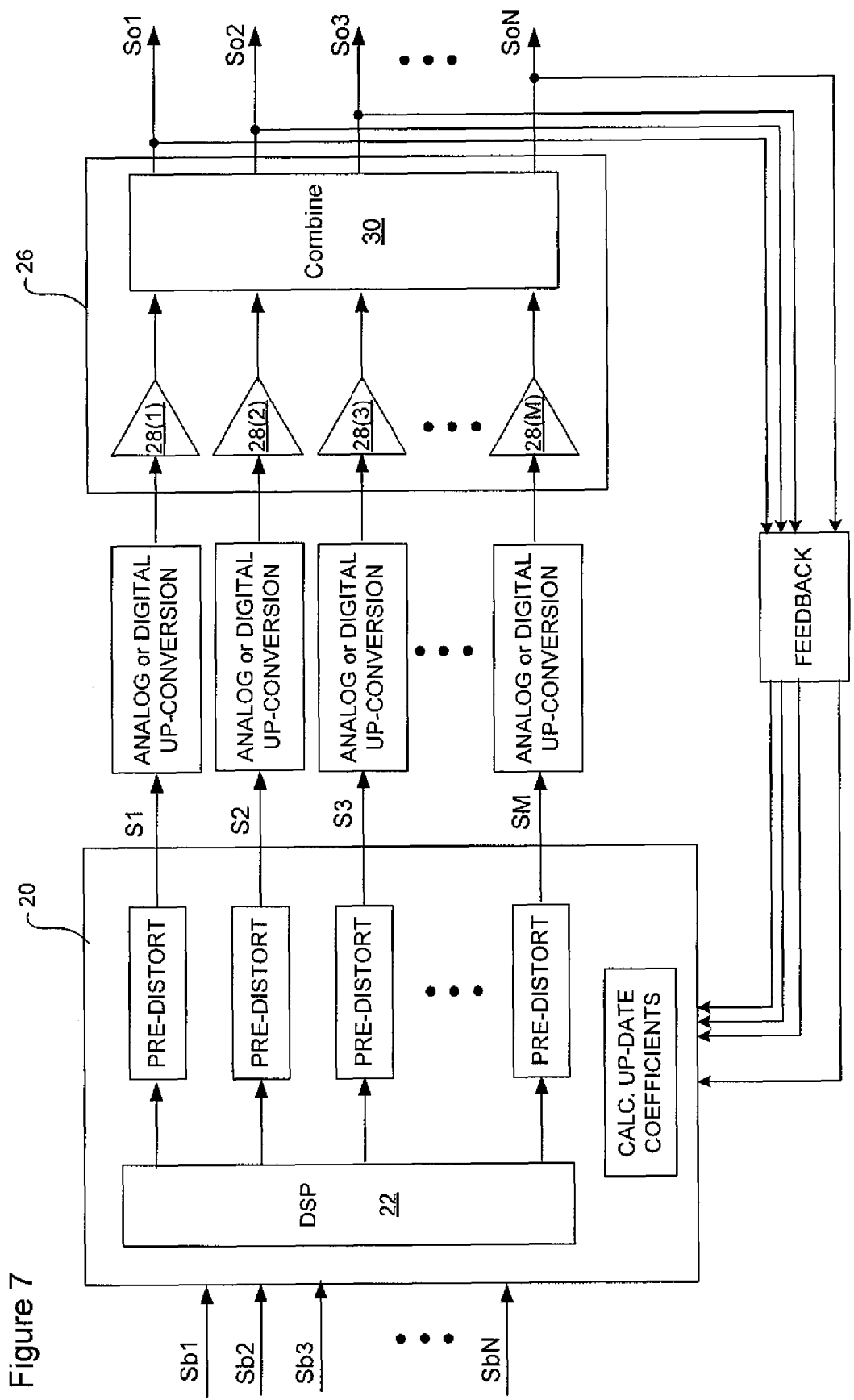
FIG. 7 is a block diagram schematically illustrating a generalized N-Branch power amplifier usable in the system of FIG. 4.

FIG. 7 shows a generalized version of the transmitter of FIG. 6, where there are N input signals Sb1 ... SbN, which are processed by the transmitter to yield N corresponding output signals So1 ... SoN. The DSP 22 implements a digital splitting function to generate M branch sub-signals S1 ... SM, each of which is a predetermined function of the N input signals. The combiner network 30 at the amplifier output operates to combine the M amplified branch sub-signals to produce the desired N output signals. As will be appreciated, the splitting function implemented by the DSP 22 is related to the desired amplifier arrangement, and the combining network 30 is matched to the splitting function so that the output signals So1 ... SoN properly correspond with the input signals Sb1 ... SbN.

For this generalized case, the number of branch sub-signals can range from:

For N=1: M=2

For N>=2: M>=N

The case of M=N+1 corresponds, for example, to an amplifier arrangement in which N amplifiers are used to amplify a respective main signal component Sm of each baseband input signal, while a common peaking amplifier is used to amplify a composite peaking signal which is the sum of the peaking signal components of all of the input signals.

In the foregoing description, the equalizer 20 is described as implementing a two-step process, in which the process of generating the individual branch signals and then pre-distorting the branch signals are performed as two sequential steps. However, those of ordinary skill in the art will recognise that the DSP 22 and pre-distorters 24 can be implemented using a single physical device (such as, for example, a Random Access Memory look-up table). In such a case, both the signal splitting and pre-distortion steps can be mathematically merged into a single operation.

A further alternative may be to conceptually reverse the order of operations. In such a case, the respective different portions of the input signal can be defined (for example based on a threshold comparison, as illustrated in FIG. 3), such that each defined portion corresponds with a respective one of the sub-signals. The Input signal can then be processed to pre-distort each portion of the signal, based on the performance characteristics of its associated branch of the multiple path amplifier. Finally, each of the predistorted portions of the input signal can then be supplied to the respective branches of the multiple path amplifier.

As described above, the digital equalizer 20 is capable of applying virtually any desired mathematical operation to the input signal(s) So. As such, the DSP 22 can implement any desired mathematical function for generating the branch signals. The classical "amplitude splitting" function described above with reference to FIG. 3 is one such function, but the DSP 22 is not limited to this. As will be appreciated, in practice, the primary limitations on the functions used to generate the branch sub-signal, are imposed by the signal combiner 30, which is an analog signal combiner network. Thus, which it is possible to define any number of mathematical functions by which N input signals Sb may be transformed into M sub-signals, which are amplified and then subsequently recombined into the desired output signals So, only some of these relations will be realizable in a practical analog combiner network. Accordingly, it is anticipated that the combiner network 30 will be designed first, in order to obtain a practically realizable signal combining function, and then the complementary (signal splitting) function implemented by the DSP 22 will be designed.

Figure 8A:
FIG. 8A illustrates two types of 90° hybrid known in the art.

For example, FIG. 8A shows two types of conventional 90° hybrid, well known in the art, namely: a 90° hybrid 32 and a 4.78 dB 90° hybrid 33. As is well known in the art, each hybrid receives two inputs (labelled as "in" and "Isol." in FIG. 8A), and produces two outputs (labelled as So1 and So2 in FIG. 8A). For the 90° hybrid 32, $$So1 = \frac{1}{\sqrt{2}}\text{in} - j\frac{1}{\sqrt{2}}Isol, \text{ and } So2 = \frac{1}{\sqrt{2}}Isol - j\frac{1}{\sqrt{2}}\text{in}.$$

For the 4.78 dB 90° hybrid 33, $$So1 = \frac{1}{\sqrt{3}}\text{in} - j\sqrt{\frac{2}{3}}Isol, \text{ and } So2 = \frac{1}{\sqrt{3}}Isol - j\sqrt{\frac{2}{3}}\text{in}.$$

Figure 8B:
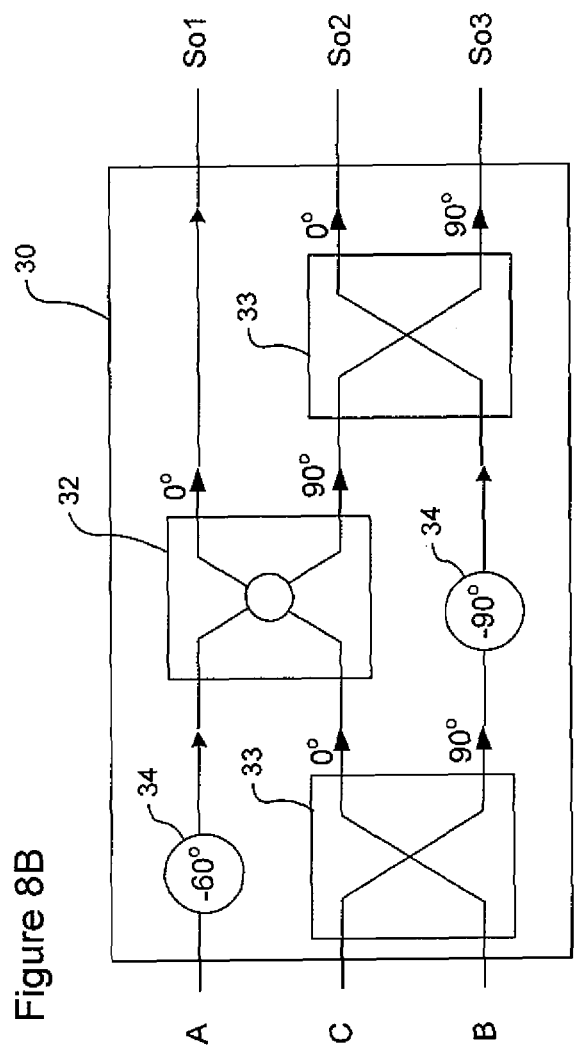
FIGS. 8B-C are block diagrams schematically illustrating possible combiner networks constructed using the 90° hybrids shown in FIG. 8A.

As shown in FIG. 8B, the 90° hybrids 32 and 33 can be interconnected, along with phase delays 34, to form a combiner network 30 that implements the function:

$$\begin{bmatrix} So1 \\ So2 \\ So3 \end{bmatrix} = \frac{1}{\sqrt{3}} \begin{bmatrix} -60° & -90° & -180° \\ -150° & 60° & -150° \\ 120° & -150° & -120° \end{bmatrix} \begin{bmatrix} A \\ C \\ B \end{bmatrix}$$

For embodiments in which three branch sub-signals are to be combined to yield two output signals, then one of the output signals produced by the combiner network (e.g. So3) corresponds to a "don't care" condition, and so can be terminated. The complementary function, for splitting two baseband input signals (e.g. Sb1 and Sb2) into the branch signals A, B and C can then be derived from the combiner function using known techniques, for implementation by the DSP 22.

Figure 8C:
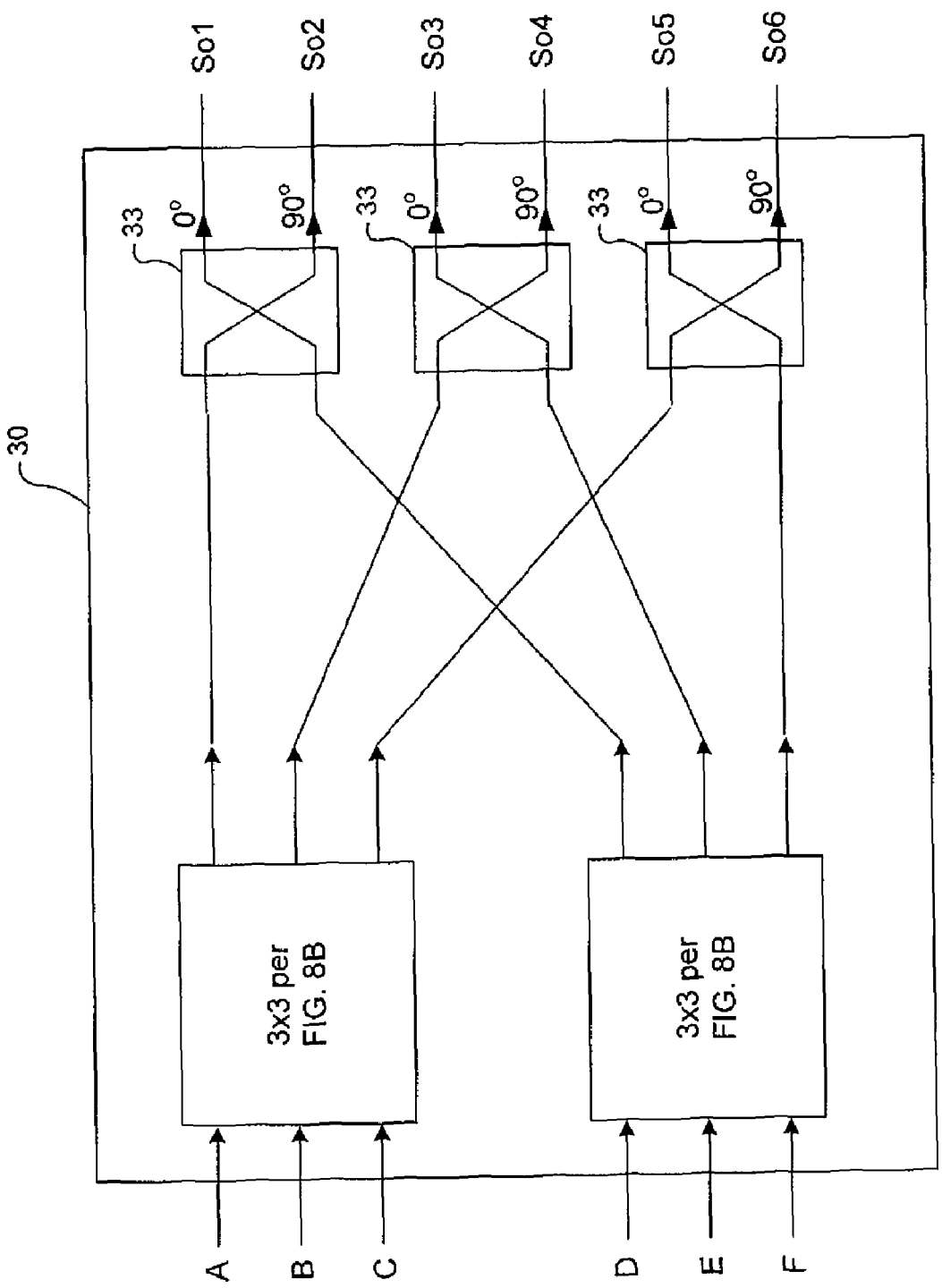

If desired, the combiner network 30 of FIG. 8B, may be further combined, to yield the 6×6 combiner network of FIG. 8C, which has the combiner function:

$$\begin{bmatrix} So1 \\ So2 \\ So3 \\ So4 \\ So5 \\ So6 \end{bmatrix} = \frac{1}{\sqrt{6}} \begin{bmatrix} -60° & -90° & 180° & -150° & 180° & 90° \\ -150° & 60° & -150° & 120° & -30° & 120° \\ 120° & -150° & -120° & 30° & 120° & 150° \\ -150° & 180° & 90° & -60° & -90° & 180° \\ 120° & -30° & 120° & -150° & 60° & -150° \\ 30° & 120° & 150° & 120° & -150° & -120° \end{bmatrix} \begin{bmatrix} A \\ B \\ C \\ D \\ E \\ F \end{bmatrix}$$

As may be seen, this combiner matrix combines M=6 branch sub signals A . . . F to yield six output signals So1 . . . So6. Here again, in an embodiment in which fewer than six output signals are desired (i.e., N<6), the unused output(s) are simply terminated. The complementary function, for splitting N<=6 input signals Sb into M=6 branch sub signals A . . . F can then be derived from the combiner function using known techniques, for implementation by the DSP 22.

As may be appreciated, the pattern of FIGS. 8B and 8C may be repeated, as desired, to construct combiner networks of larger sizes, if desired.

The embodiments of the invention described above are intended to be illustrative only. The scope of the invention is therefore intended to be limited solely by the scope of the appended claims.

We claim:

1. A method of optimizing performance of a multiple path amplifier, the method comprising:
    digitally processing N,N>1, input signals to generate a respective sub-signal for each of M, M>2, branches of the multiple path amplifier;
    digitally pre-distorting each sub-signal using a known performance characteristic of its associated branch of the multiple path amplifier; and
    supplying each pre-distorted sub-signal to its associated branch of the multiple path amplifier, wherein the multiple path amplifier comprises a combiner network for combining M amplified sub-signals from each branch to generate N output signals, and wherein digitally processing the N input signals comprises:
    defining each one of the M sub-signals as a respective predetermined function of the N input signals; and
    for each sub-signal, digitally processing the N input signals using the respective predetermined function.

2. A method as claimed in claim 1, further comprising:
    within each branch of the multi-path amplifier, performing a respective amplification.

3. A method as claimed in claim 1, wherein the steps of digitally processing the N input signals to generate a respective sub-signal for each of M, M>2, branches of the multiple path amplifier and digitally pre-distorting each sub-signal are performed sequentially.

4. A method as claimed in claim 1, wherein the steps of digitally processing the N input signals to generate a respective sub-signal for each of M, M>2, branches of the multiple path amplifier and digitally pre-distorting each sub-signal are performed as a single operation.

5. A method as claimed in claim 1, wherein pre-distorting each sub-signal comprises, for each sub-signal, digitally processing the sub-signal using a respective set of predetermined coefficients.

6. A method as claimed in claim 5, wherein the respective set of predetermined coefficients are adaptively computed to optimize at least one parameter of the associated branch of the multiple path amplifier.

7. A method as claimed in claim 6, wherein the at least one parameter comprises any one or more of:
    a difference between the input signal and a corresponding output signal of the multiple path amplifier;
    a difference between the input signal and a corresponding amplified sub-signal within the associated branch of the multiple path amplifier;
    an amplifier parameter of the associated branch of the multiple path amplifier.

8. A method as claimed in claim 7, wherein the amplifier parameter of the associated branch comprises any one or more of an amplifier voltage, amplifier current and gate bias.

9. A method as claimed in claim 6, wherein the respective set of predetermined coefficients are computed once.

10. A method as claimed in claim 6, wherein the respective set of predetermined coefficients are periodically updated.

11. A digital linearizer for optimizing performance of a multiple path amplifier, the digital linearizer comprising:

a digital signal processor for digitally processing N,N>1, input signals to generate a respective sub-signal for each of M, M>2, branches of the multiple path amplifier; and a respective pre-distorter for digitally pre-distorting each sub-signal using a known performance characteristic of its associated branch of the multiple path amplifier, an output of each pre-distorter being connected to supply a pre-distorted sub-signal to its associated branch of the multiple path amplifier wherein the multiple path amplifier comprises a combiner network for combining M amplified sub-signals from each branch to generate N output signals, and wherein the digital signal processor is configured to digitally process the N input signals by:

defining each one of the M sub-signals as a respective predetermined function of the N input signals; and for each sub-signal, digitally processing the N input signals using the respective predetermined function.

12. A digital linearizer as claimed in claim 11, wherein the digital signal processor and the respective pre-distorter for each sub-signal are provided as separate components.

13. A digital linearizer as claimed in claim 11, wherein the digital signal processor and the respective pre-distorter for each sub-signal are provided as a single component.

14. A digital linearizer as claimed in claim 13, wherein the single component comprises a Random Access memory Look-Up Table.

15. A method as claimed in claim 1, wherein N=2 and M=3.

16. A digital linearizer as claimed in claim 11, wherein N=2 and M=3.

* * * * *